US009892966B1

(12) United States Patent
Trester

(10) Patent No.: US 9,892,966 B1
(45) Date of Patent: Feb. 13, 2018

(54) METAL ONLY POST-MASK ECO FOR INTEGRATED CIRCUIT

(71) Applicant: NXP B.V., Eindhoven (NL)

(72) Inventor: Sven Trester, Gratkorn (AT)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/378,046

(22) Filed: Dec. 14, 2016

(51) Int. Cl.
*G06F 17/50* (2006.01)
*H01L 21/768* (2006.01)
*H01L 23/522* (2006.01)
*H01L 23/528* (2006.01)

(52) U.S. Cl.
CPC .... *H01L 21/76892* (2013.01); *G06F 17/5077* (2013.01); *H01L 23/528* (2013.01); *H01L 23/5225* (2013.01); *H01L 23/5226* (2013.01)

(58) Field of Classification Search
CPC ................................................ H01L 21/76892
USPC ......................................................... 716/116
See application file for complete search history.

(56) References Cited

U.S. PATENT DOCUMENTS

| 5,623,420 | A | 4/1997 | Yee et al. | |
|---|---|---|---|---|
| 7,076,759 | B2 | 7/2006 | Jurgens et al. | |
| 7,458,051 | B2 * | 11/2008 | Hou | G11O 5/063 716/120 |
| 8,214,774 | B2 | 7/2012 | Nardone et al. | |
| 8,307,321 | B2 | 11/2012 | Liu et al. | |
| 8,423,946 | B1 * | 4/2013 | Jin | G06F 17/5045 716/126 |
| 8,645,892 | B1 * | 2/2014 | Gupta | G06F 17/5077 326/101 |
| 2006/0075370 | A1 | 4/2006 | Williams et al. | |
| 2006/0288323 | A1 * | 12/2006 | Birch | G06F 17/5077 716/129 |
| 2013/0069169 | A1 * | 3/2013 | Kwon | H01L 27/0207 257/401 |
| 2016/0070842 | A1 * | 3/2016 | Barowski | G06F 17/5077 716/130 |

FOREIGN PATENT DOCUMENTS

CN              105069228 A       11/2015

* cited by examiner

*Primary Examiner* — Suresh Memula
(74) *Attorney, Agent, or Firm* — Charles E. Bergere

(57) ABSTRACT

A method of designing a layout of a metallization stack of an integrated circuit (IC), where the stack includes metal layers having patterned metal features. The method includes determining a layout of a first grid of the metallization stack, including patterned metal features for supplying power and providing signal connections to components of the IC. The method also includes determining a layout of a second grid of the stack for securing the IC against electromagnetic attacks. The second grid includes patterned metal features interspersed with the patterned metal features of the first grid in at least some of the metal layers of the metallization stack. The patterned metal features of the second grid are electrically connected to the first grid. The method further includes determining at least one layout change for the metallization stack in accordance with an engineering change order.

19 Claims, 13 Drawing Sheets

METAL ONLY POST-MASK ECO FOR INTEGRATED CIRCUIT

BACKGROUND

The present invention relates generally to a method of designing a physical layout of a semiconductor integrated circuit, and, more particularly, to a metallization stack to be located on a major surface of a semiconductor substrate of an integrated circuit.

Integrated circuits generally include a semiconductor substrate including active or passive components (transistors, diodes, etc.), and a metallization stack provided on a major surface of the substrate. The metallization stack includes a plurality of patterned metal layers separated by intervening dielectric. The metal layers in the stack can be used to route, for instance, power supply lines, ground lines and signal lines within the integrated circuit.

Electromagnetic attacks against secure integrated circuits involve placing an induction loop over a surface of the integrated circuit to attempt to detect currents passing within the metal levels of the metallization stack.

When designing integrated circuits, it is often required to apply changes to the design at a relatively late stage in the design and manufacturing process. State of the art integrated circuits may contain measures to apply post mask changes to the design without recreation of the complete mask set. Where possible, the design changes may be limited to the backend layers to save both time and cost. Wafers may be stopped after manufacturing of the frontend layers and stored for later completion. The changes may be applied by adding, removing or changing connections between cells of the integrated circuit. Furthermore, spare cells or spare filler cells may be included to provide more flexibility in changing or correcting the functionality of the design.

The implementation of the changed connectivity may involve re-routing in the backend layers, including vias and metal lines thereof, to remove, change or add connections between existing cells or to include the spare cells in these connections. The implementation of the new connectivity typically requires changes in the backend stack of metal and via layers, which in turn requires changes to at least some of the metal layer and via layer masks used to manufacture the stack. Making changes to one or more masks of the mask set may lead to shipping delays and may be expensive.

SUMMARY

Aspects of the present invention are set out in the accompanying independent and dependent claims. Combinations of features from the dependent claims may be combined with features of the independent claims as appropriate and not merely as explicitly set out in the claims.

In one embodiment, the present invention comprises a method of designing a layout of a metallization stack to be located on a major surface of a semiconductor substrate of an integrated circuit. The metallization stack comprises a plurality of metal layers including patterned metal features. Each metal layer of the metallization stack is separated by an intervening dielectric layer. The method includes determining a layout of a first grid of the metallization stack, including patterned metal features for supplying power and providing signal connections to components of the integrated circuit located in the semiconductor substrate; determining a layout of a second grid of the metallization stack for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid; and determining at least one layout change for the metallization stack in accordance with an engineering change order (ECO). The layout change comprises the disconnection from the second grid at least one patterned metal feature of the second grid, and the connection of the disconnected patterned metal feature of the second grid to at least one patterned metal feature of the first grid.

In another embodiment, the present invention comprises a computer-readable storage medium including computer-readable instruction code for performing a method of designing a layout of a metallization stack to be located on a major surface of the semiconductor substrate of an integrated circuit. The metallization stack comprises a plurality of metal layers including patterned metal features, wherein each metal layer of the metallization stack is separated by an intervening dielectric layer. The method comprises determining a layout of a first grid of the metallization stack, including patterned metal features for supplying power and providing signal connections to components of the integrated circuit located in the semiconductor substrate; determining a layout of a second grid of the metallization stack for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid; and determining at least one layout change for the metallization stack in accordance with an ECO. The layout change comprises the disconnection from the second grid at least one patterned metal feature of said second grid; and the connection of the disconnected patterned metal feature of the second grid to at least one patterned metal feature of the first grid.

In yet another embodiment, the present invention provides a method of making an integrated circuit comprising a semiconductor substrate and a metallization stack located on a major surface of the semiconductor substrate. The metallization stack comprising a plurality of metal layers including patterned metal features, wherein each metal layer of the metallization stack is separated by an intervening dielectric layer. The method comprises designing a layout of the metallization stack by: determining a layout of a first grid of the metallization stack, including patterned metal features for supplying power and providing signal connections to components of the integrated circuit located in the semiconductor substrate; determining a layout of a second grid of the metallization stack for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid; and determining at least one layout change for the metallization stack in accordance with an ECO. The layout change comprises the disconnection from the second grid at least one patterned metal feature of said second grid; the connection of the disconnected patterned metal feature of the second grid to at least one patterned metal feature of the first grid; and forming the metallization stack on the major surface of the semiconductor substrate according to the designed layout.

In yet another embodiment, the present invention provides an integrated circuit. The integrated circuit comprises a semiconductor substrate and a metallization stack located on a major surface of the semiconductor substrate. The metallization stack comprises a plurality of metal layers including patterned metal features, wherein each metal layer of the metallization stack is separated by an intervening dielectric layer. The integrated circuit is fabricated by a method comprising: designing a layout of the metallization stack by: determining a layout of a first grid of the metallization stack, including patterned metal features for supplying power and providing signal connections to components of the integrated circuit located in the semiconductor substrate; determining a layout of a second grid of the metallization stack for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid; and determining at least one layout change for the metallization stack in accordance with an ECO. The layout change comprises the disconnection from the second grid at least one patterned metal feature of said second grid; and the connection of the disconnected patterned metal feature of the second grid to at least one patterned metal feature of the first grid. The method further comprises forming the metallization stack on the major surface of the semiconductor substrate according to the designed layout.

Embodiments of the present invention allow an ECO to be implemented in a manner that conveniently makes use of features of the second grid, which is nominally provided as an anti-tampering measure, to form new connections within the first grid.

In one embodiment, the connection of the disconnected patterned metal feature of the second grid to at least one patterned metal feature of the first grid comprises the connection of the disconnected patterned metal feature of the second grid to at least one patterned metal feature of the first grid that provides signal connections to components of the integrated circuit located in the semiconductor substrate. This allows the layout change to implement the re-routing of signals within the metallization stack in accordance with the engineering change order.

In one embodiment, the connection of the disconnected patterned metal feature of the second grid to the least one patterned metal feature of the first grid connects together two patterned metal features of the first grid. This allows the layout change to implement the interconnection of features of the first grid which were not interconnected in the initial design of the layout.

In one embodiment, the at least one layout change connects at least one patterned metal feature of the first grid to a spare cell of components of the integrated circuit located in the semiconductor substrate. This allows the layout change to implement the connection of a spare cell of the integrated circuit to the first grid. Spare cells or spare filler cells may be included in the integrated circuit to provide more flexibility in changing or correcting the functionality of the design.

In one embodiment, the first grid and the second grid each include metal filled vias located in the intervening dielectric layers for interconnecting patterned metal features of the grids located in different metal layers of the metallization stack. The determining at least one layout change for the metallization stack in accordance with the ECO includes incorporating at least one metal filled via of the second grid into the first grid. This allows existing vias of the second grid to be used to implement new connections in the first grid. In this way, the creation of new masks associated with the via layers of the metallization stack for implementing the ECO may be avoided. This can reduce the costs associated with implementing the engineering change order.

In one embodiment, the patterned metal feature of the first grid to which the patterned metal feature of the second grid is to be connected is located in a first layer of the metallization stack. The incorporating at least one metal filled via of the second grid into the first grid comprises adding one or more further patterned metal features to the first grid in the first layer of the metallization stack, to connect the patterned metal feature of the first grid to the at least one via.

In one embodiment, determining the layout change further comprises the disconnection of at least one patterned metal feature of the second grid from at least one other patterned metal feature of the second grid. This allows the disconnected patterned metal feature of the second grid, which is to be re-used as part of the first grid, to be isolated from the second grid, preventing unwanted shorting between the first grid and the second grid.

In one embodiment, the patterned metal features of the first grid and the second grid comprise metal lines extending within at least some of the metal layers of the metallization stack. The width of the metal lines of the second grid may be relatively small. For instance, a width of the metal lines of the second grid may be smaller than the a width of the patterned metal features of the first grid forming power supply or ground connections of the first grid. In some examples, a width of the metal lines of the second grid may be substantially equal to a width of patterned metal features of the first grid forming signal connections of the first grid. In this way, it may be made difficult to distinguish between the metal lines of the second grid and the metal features of the first grid forming signal connections (which may also be metal lines). This may make attacks against the security of the integrated circuit more difficult. In some examples, a width of the metal lines of the second grid may be substantially equal to a design rule minimum width for metal features of the metallization stack. By reducing the width of the metal lines of the second grid, the complexity and density of the layout of the second grid may be increased, making electromagnetic attacks against the security of the integrated circuit more difficult. In some examples, the metal lines of the second grid may include metal lines extending in first and second orthogonal directions within the metallization stack. Again, this can increase the complexity of the layout of the second grid, making electromagnetic attacks against the security of the integrated circuit more difficult. Adjacent metal layers of the metallization stack may include metal lines extending in either the first or the second orthogonal direction, respectively. By alternating the direction of the metal lines of the second grid in successive layers of the metallization stack, capacitive and inductive coupling between the metal lines of the second grid in adjacent metal layers may be reduced.

In one embodiment, at least some of the patterned metal features of the second grid are electrically connected to patterned metal features of the first grid that form power supply connections or ground connections of the first grid. Note that these approaches may be combined, whereby some of the patterned metal features of the second grid may be electrically connected to power supply connections of the first grid while others of the patterned metal features of the second grid may be electrically connected to ground connections of the first grid. Note that connection of the patterned metal features of the second grid to power supply connections or ground connections of the integrated circuit may also reduce the resistance of these connections by providing additional path(s) for current flow.

Embodiments of the present invention allow an integrated circuit to be secured against electromagnetic attacks (EMAs) involving, for instance, using a probe comprising an inductive loop to detect currents flowing within the metallization stack. In the first instance, it may be difficult to distinguish between features of the first grid and the second grid, so that the attacker cannot be sure as to the correct metal features to probe for detecting currents flowing within the first grid. Moreover, the electric fields associated with currents flowing within the patterned metal features of the second grid, which are connected to the first grid, may complicate detection of currents in the first grid using an induction loop. An attacker may not, for instance, be sure that a detected electric field may be attributed to current flow in a metal feature of the first grid and/or may not be sure that the detected electric field has not be distorted by current flow within the second grid.

The problems faced by an attacker, as described above, may be enhanced by the fact that the patterned metal features of the second grid are interspersed with those of the first grid, instead of being provided separately (e.g., in a metal layer overlaying the metal layers incorporating the features of the first grid). This may make it difficult or impossible to physically remove the second grid before conducting EMAs against the integrated circuit, and the proximity of the patterned metal features of the first and second grids may make it particularly difficult to distinguish between them or between the electric fields associated with current flowing within them.

The components of the integrated circuit located in the semiconductor substrate may for instance comprise active components (such as transistors or diodes) and/or passive components (such as resistors or capacitors). A layout of the patterned metal features of the second grid may be irregular. For instance, the layout of the patterned metal features of the second grid may be non-repeating and may appear random (or pseudo-random).

In some examples, certain characteristics of the patterned metal features of the second grid, such as their width or spacing or whether they are connected to a power supply connection or to a ground connection, may be different at different locations of the metallization stack. In this way, the layout of the second grid may, for instance, be tailored to the local configuration of the first grid.

According to a further aspect of the present invention, there is provided a secure element including an integrated circuit of the kind described above. The secure element may, for instance, be provided in a credit card, health card or a passport. The present invention also provides a mobile communications device including a secure element of the kind described above. The mobile communications device may, for instance, be a mobile telephone, tablet, watch, laptop or other device.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings. Embodiments of the invention provide an integrated circuit including a semiconductor substrate having a metallization stack located on a major surface thereof. As will be described in more detail below, the metallization stack may form first and second grids. The first grid may supply power and provide signal connections to components (e.g., active and/or passive components) of the integrated circuit located in the substrate, while the second grid may provide secure the integrated circuit against electromagnetic attacks.

The metallization stack may include a plurality of patterned metal layers deposited on the major surface of the semiconductor substrate. Each metal layer of the metallization stack may be separated from neighbouring layers in the metallization stack by an intervening dielectric layer. Each metal layer of the metallization stack may include patterned metal features, as will be described below. The technology used to form metallization stacks on semiconductor substrates is well established and will not be described herein in detail.

The various metal layers of a metallization stack according to an embodiment of the present invention will be described herein below with reference to FIGS. 1 to 7.

Figure 1:
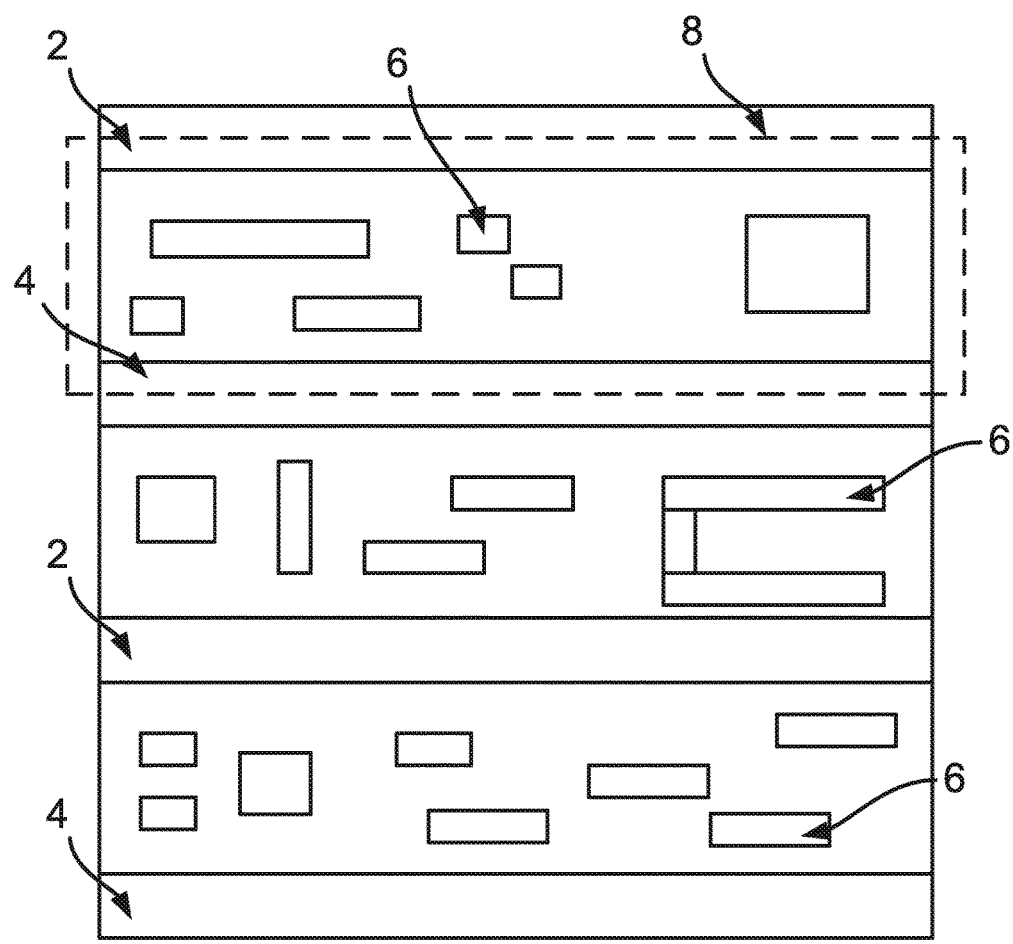
FIG. 1 shows a layout of a first metal layer in a metallization stack.
Figure 2:
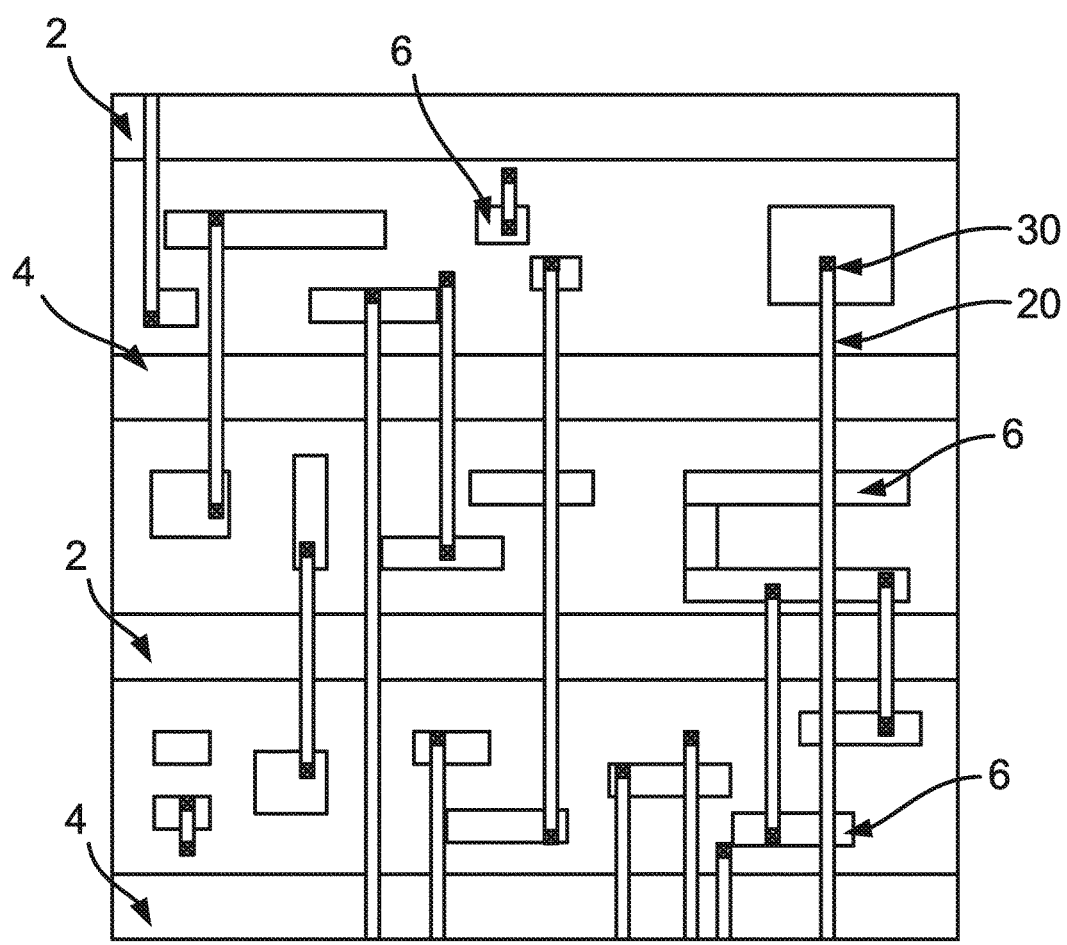
FIG. 2 shows a layout of a first and a second metal layer in a metallization stack.
Figure 3:
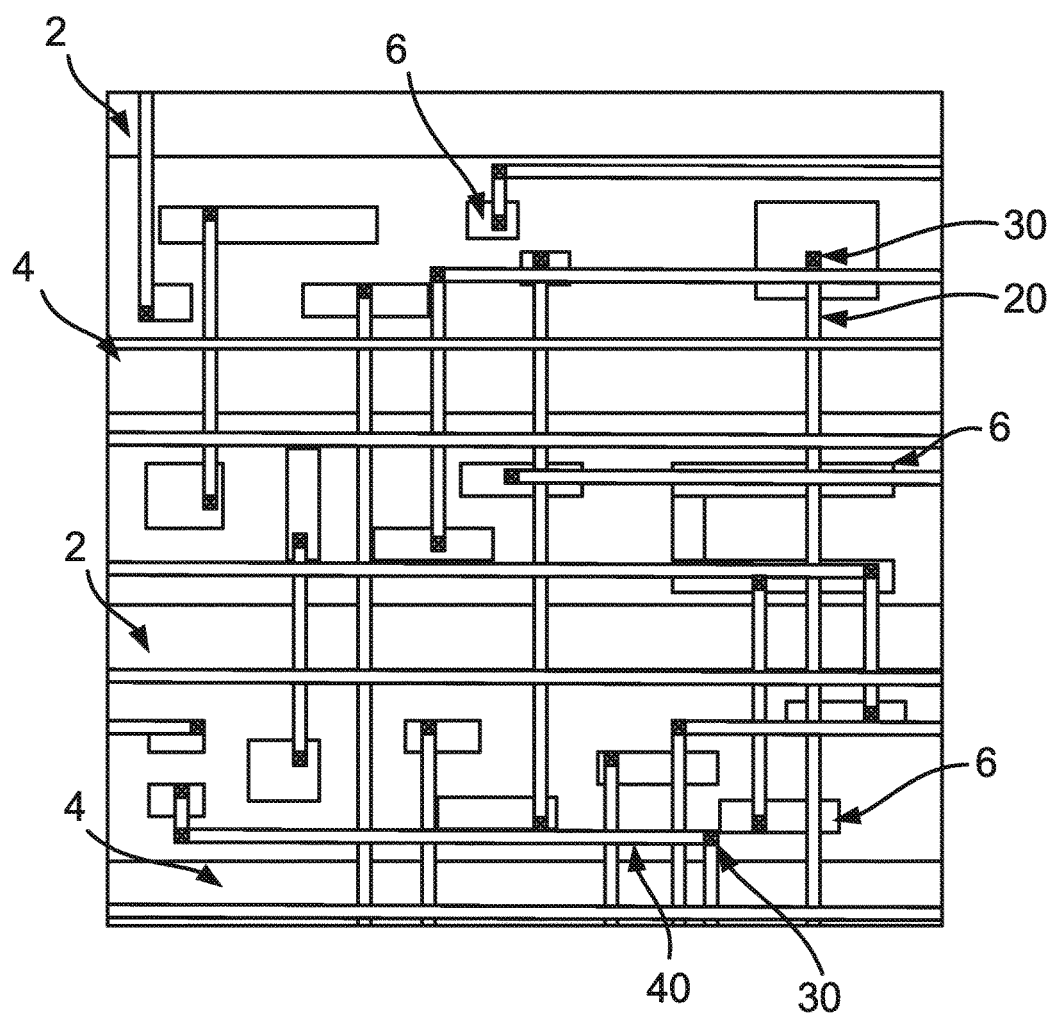
FIG. 3 shows a layout of a first, a second and a third metal layer in a metallization stack.

FIGS. 1 to 3 show the patterned metal features of a first grid formed by a metallization stack in accordance with an embodiment of the present invention. In this embodiment, the metallization stack includes a plurality of metal layers. FIG. 1 shows a lowest metal layer in the stack (this may also be referred to as "M1" or "Metal 1"). Metal layer M1 is the closest metal layer to the major surface of the semiconductor substrate upon which the metallization stack is provided. FIG. 2 additionally shows a next metal layer in the metallization stack (this may also be referred to as "M2" or "Metal 2"). Metal layer M2 neighbors metal layer M1 and is located directly above metal layer M1 in the stack. FIG. 3 additionally shows a next metal layer in the metallization stack (this may also be referred to as "M3" or "Metal 3"). Metal layer M3 neighbors metal layer M2 and is located directly above metal layer M2 in the stack.

Hence, the features of metal layer M1 can be seen in FIG. 1, the features of metal layers M1 and M2 can be seen in FIG. 2, and the features of metal layers M1, M2 and M3 can be seen in FIG. 3. Further metal layers may be provided in the stack (e.g. metal layers M4, M5 . . . ), but for the purposes of brevity, only three metal layers are described in this example.

As is known in the art of semiconductor manufacturing, one or more passivation layers may be provided at the top of the stack. Openings may be formed in the passivation layer(s) for making electrical connections to the stack. Metal filled vias may extend through the intervening dielectric layers of the metallization stack to interconnect the patterned metal features of the metal layers.

Each metal layer in the stack includes a plurality of patterned metal features. These metal features may include, for instance, islands and/or metal lines for forming electrical interconnections within the stack. As is known in the art, these patterned metal features can allow power to be distributed within the stack for powering active or passive components, such as transistors, diodes, resistors or capacitors located within the semiconductor substrate of the integrated circuit. The patterned metal features may also provide connections for distributing signals within the stack, for instance between the active or passive components of the integrated circuit. These power and signal connections may constitute a first grid formed by the metallization stack. As will be described later in relation to FIGS. 5 to 7, the metallization stack also forms a second grid.

In this example, metal layer M1 includes patterned metal features forming one or more power supply connections 2 and one or more ground connections 4. The power supply connection(s) 2 and ground connection(s) 4 may include patterned metal lines extending over the major surface of the semiconductor substrate, within metal layer M1. The power supply connection(s) 2 and/or ground connection(s) 4 may be connected to one or more pins of the integrated circuit, for connecting to an external power source, or may be connected to an IC internal power generator.

In the present embodiment, all of the power supply and ground connections of the first grid of the metallization stack are provided in the first metal layer M1, although it is envisaged that power supply and/or ground connections of the first grid may be provided in other metal layer(s). And metal layer M1 also includes patterned metal features forming signal connections 6 within the stack. The signal connections 6 may, for instance be island shaped or may take the form of patterned metal lines extending over the major surface of the semiconductor substrate, within metal layer M1. As previously noted, the signal connections 6 may allow signals to be distributed within the stack. Since metal layer M1 is the lowest metal layer in the stack, at least some of the signal connections in metal layer M1 may connect directly with underlying components of integrated circuit within the substrate. Metal filled vias extending down to the substrate beneath the stack may be used to form these connections.

The metallization stack in this embodiment may include a plurality of standard cells. These standard cells, and the metal features that they contain, may be repeated at a plurality of locations within the stack. One such standard cell is illustrated by the dashed box labelled 8 in FIG. 1.

In this example, metal layer M2 includes a plurality of signal connections 20. These signal connections may take the form of metal lines extending over the major surface of the semiconductor substrate, within metal layer M2. In this example, the metal lines forming the signal connections 20 in metal layer M2 may all extend in a first direction within metal layer M2. However, it is envisaged that at least some of the metal lines forming the signal connections 20 in metal layer M2 may extend in a second direction within metal layer M2. The second direction may be substantially orthogonal to the first direction.

Metal filled vias 30 extending through the intervening dielectric layers of the metallization stack may interconnect the signal connections 20 of the metal layer M2 with the signal connections in other metal layers of the stack, such as metal layers M1 and/or M3. For instance, FIG. 2 shows a number of metal filled vias 30 connecting the signal connections 20 of metal layer M2 to the signal connections 6 of metal layer M1.

As can be seen in FIG. 3, metal layer M3 in this example also includes a plurality of signal connections 40. FIG. 3 also shows a number of metal filled vias 30 connecting the signal connections 40 of metal layer M3 to the signal connections 20 of metal layer M2. The signal connections 40 may take the form of metal lines extending over the major surface of the semiconductor substrate, within metal layer M3. In this example, the metal lines forming the signal connections 40 in metal layer M3 may all extend in a second direction within metal layer M3. Hence, in this example, the signal connections 40 in metal layer M3 are all orthogonal to the signal connection 20 of metal layer M2. However, it is envisaged that at least some of the metal lines forming the signal connections 40 in metal layer M3 may extend in a different direction, such as the first direction mentioned above in relation to the signal connections 20 of the metal layer M2.

It is envisaged that at least some of the power connections and/or signal connections provided in the metal layers M1, M2, M3 may comprise metal lines having one or more turns or corners, such that different parts of the metal lines extend in different directions within the metal layer in which the metal lines are located.

Figure 4:
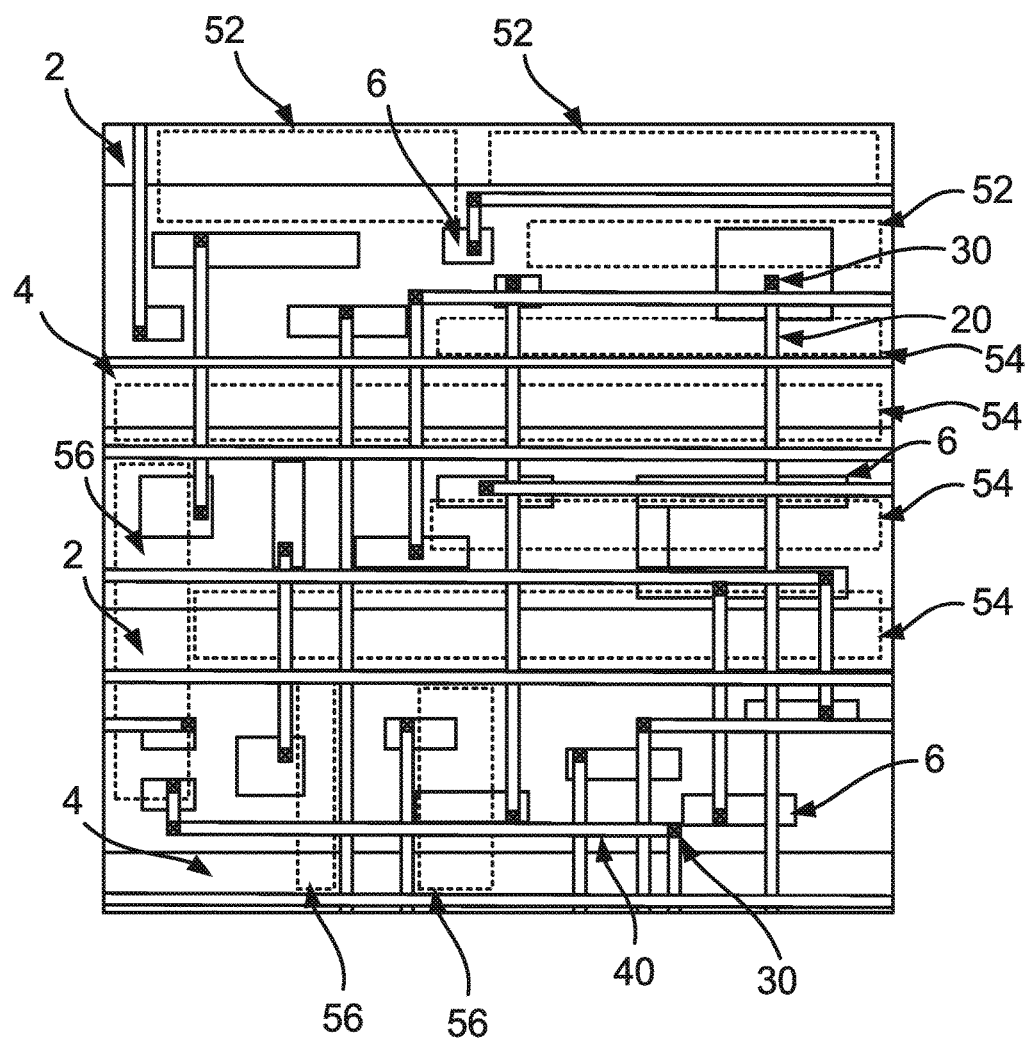
FIG. 4 shows a layout of a first, a second and a third metal layer in a metallization stack and illustrates the presence of a number of un-used areas in various layers of the stack.

FIG. 4 shows that the patterned metal features of the first grid of the metallization stack described above have a layout that leaves a number of areas unoccupied. For instance, the areas 52 in FIG. 4 are unoccupied on both metal layers M2 and M3, while the areas 54 are unoccupied in metal layer M3 and the areas 56 are unoccupied in metal layer M2.

In accordance with an embodiment of the present invention, at least some of the areas not occupied by patterned metal features of the first grid may be occupied by patterned metal features of a second grid of the metallization stack.

Figure 5:
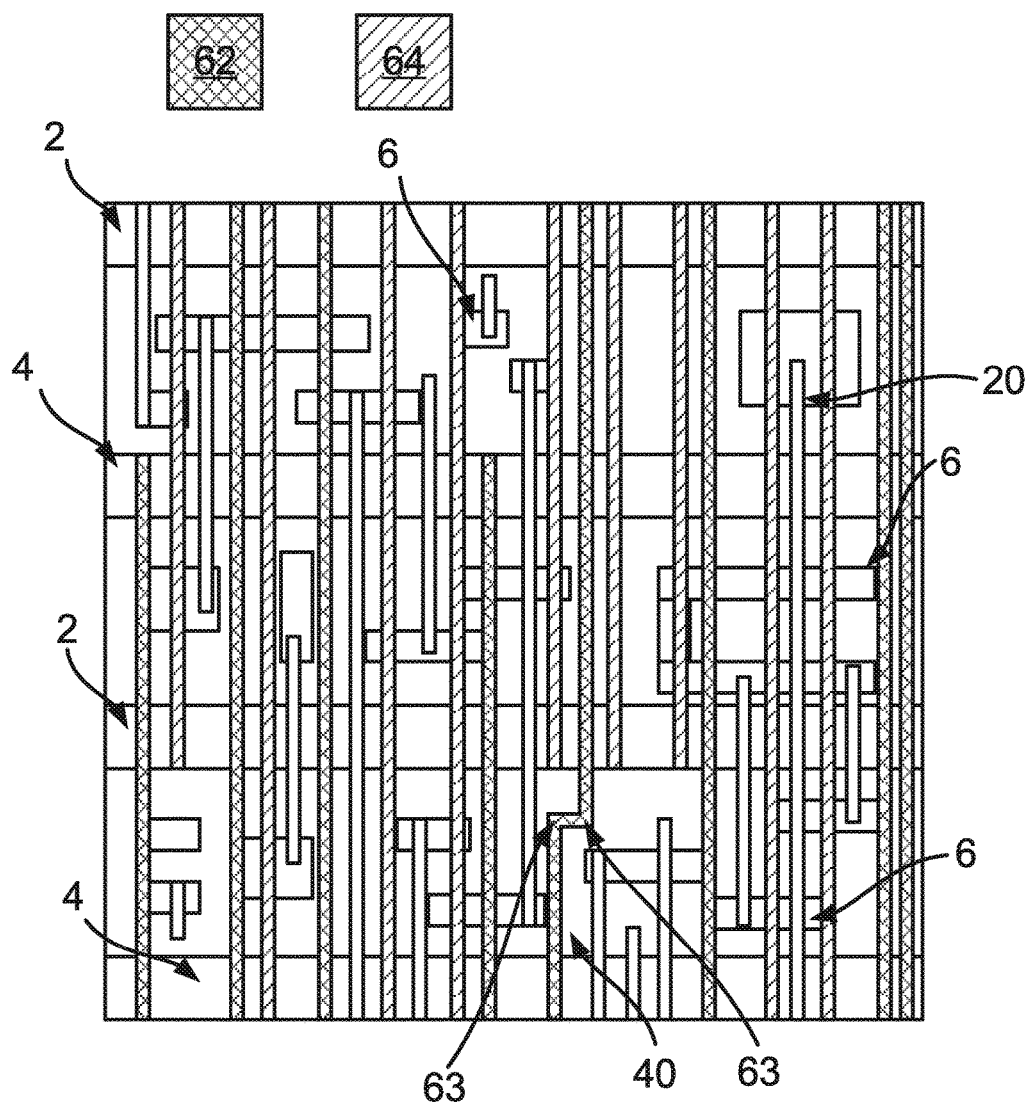
FIG. 5 shows a layout of a first and a second metal layer in a metallization stack.
Figure 6:
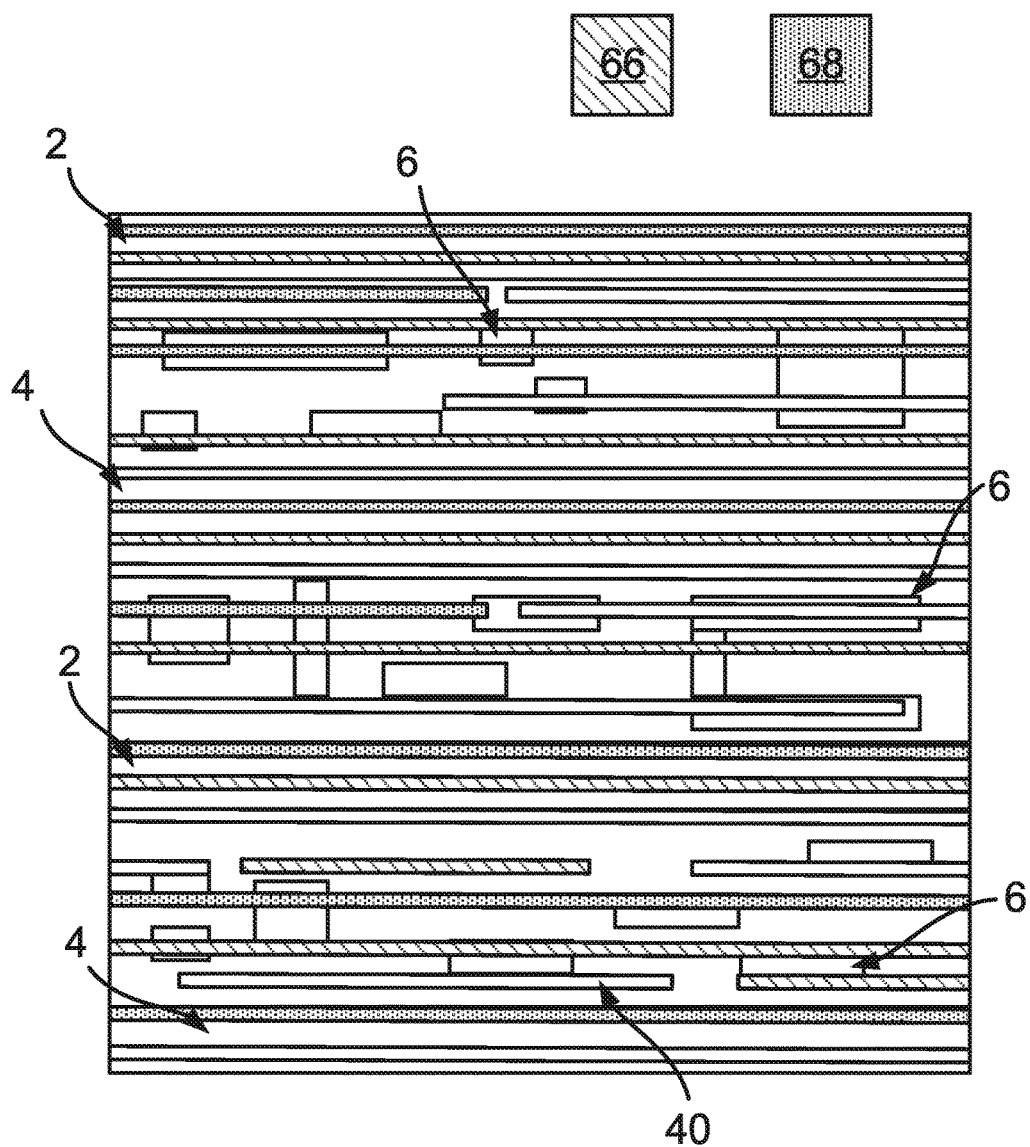
FIG. 6 shows a layout of a first and a third metal layer in a metallization stack.
Figure 7:
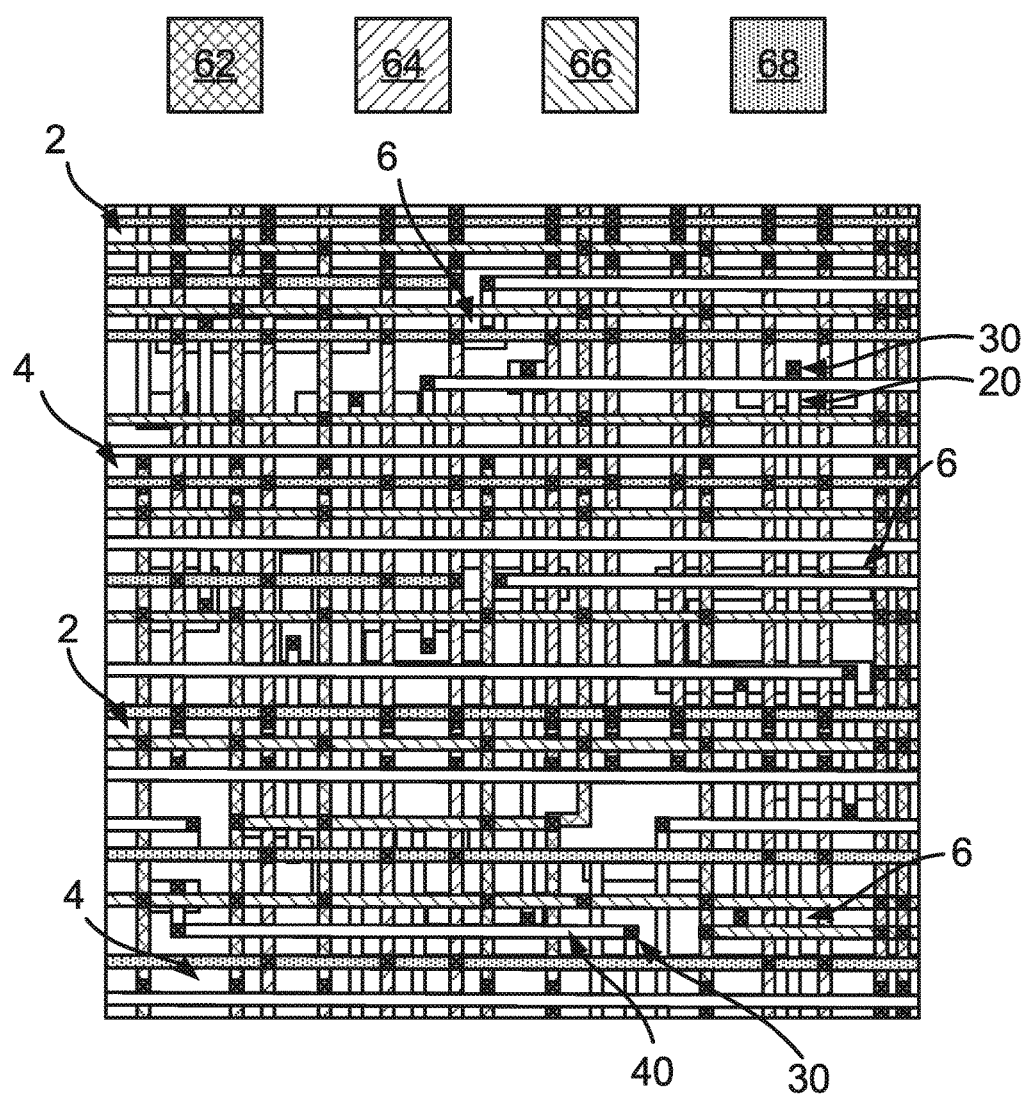
FIG. 7 shows a layout of a first, a second and a third metal layer in a metallization stack.

FIGS. 5 to 7 show the patterned metal features of a second grid formed by the metallization stack described above in relation to FIGS. 1 to 4. The patterned metal features of the first grid are also shown in FIGS. 5 to 7, so that the locations of the patterned metal features of the second grid can be seen relative to the patterned metal features of the first grid. The patterned metal features of the second grid may be provided in one or more metal layers of the metallization stack. In the present example, the patterned metal layers of the second grid are located only in metal layers M2 and M3. It is envisaged that patterned metal layers of the second grid may also be located in other metal layers, such as metal layer M1.

As can be seen from the figures, the patterned metal features of the second grid may be interspersed with the patterned metal features of the first grid. As can also be seen from the figures, the patterned metal features of the second grid may occupy areas in the metallization stack not occupied by patterned metal features of the first grid. As with the first grid, the patterned metal features of the second grid in each layer may be interconnected with the patterned metal features of the second grid in other metal layers (e.g., neighboring layers) using metal filled vias. For clarity, the vias used to interconnect the patterned metal features of the first and second grids are not shown in FIGS. 5 and 6, although they are included in FIG. 7.

FIG. 5 shows the patterned metal features of the first and second grids in metal layer M2, and also shows the patterned metal features of the first grid in metal layer M1. FIG. 6 shows the patterned metal features of the first and second grids in metal layer M3, and also shows the patterned metal features of the first grid in metal layer M1. FIG. 7 shows the patterned metal features of both grids in each of the metal layers M1, M2, M3. The patterned metal features of the second grid may be electrically connected to the first grid. For instance, at least some the patterned metal features of the second grid may be electrically connected to patterned metal features of the first grid that form power supply connections of the first grid, and/or at least some the patterned metal features of the second grid may be electrically connected to patterned metal features of the first grid that form ground connections of the first grid.

As shown in FIG. 5, the second grid in this example includes patterned metal features 62 in the metal layer M2 that may be connected to ground connections of the first grid. FIG. 5 also shows that the second grid in this example includes patterned metal features 64 in the metal layer M2 that may be connected to power supply connections of the first grid. The connection of the patterned metal features 62, 64 of the second grid to the first grid may, for instance, be implemented by metal filled vias extending through the dielectric layer between metal layer M1 and metal layer M2 to connect the patterned metal features 62 to the ground connections 4 in the first metal layer and to connect the patterned metal features 64 to the power supply connections 2 in the first metal layer. In other examples, particularly where the power supply and ground connections of the first grid are located in other metal layers of the metallization stack, the connections between the second grid and the first grid may comprise metal filled vias extending between different metal layers of the stack.

As shown in FIG. 6, the second grid in this example includes patterned metal features 66 in the metal layer M3 that may be connected to ground connections of the first grid. FIG. 6 also shows that the second grid in this example includes patterned metal features 68 in the metal layer M3 that may be connected to power supply connections of the first grid. The connection of the patterned metal features 66, 68 of the second grid to the first grid may, for instance, be implemented by metal filled vias extending through the dielectric layer between metal layer M2 and metal layer M3 to connect the patterned metal features 66 to the patterned metal features 62 and to connect the patterned metal features 68 to the patterned metal features 64. Accordingly, at least some of the patterned metal features of the second grid may be electrically connected to the first grid through other patterned metal features of the second grid, which may be located in a different metal layer in the stack. It is also envisaged that direct connections may be made between the patterned metal features 66 and the ground connections 4 in the first metal layer M1 and between the patterned metal features 68 and the power supply connections 2 in the first metal layer M1.

The patterned metal features of the second grid may, for instance, be island shaped or may take the form of patterned metal lines extending over the major surface of the semiconductor substrate, within the metal layers. In this example, most or all of the patterned metal features 62, 64 in metal layer M2 may extend in a first direction, which may be substantially the same direction as the direction in which the signal connections 20 in metal layer M2 extend. Similarly, most or all of the patterned metal features 66, 68 in metal layer M3 may extend in a second direction, which may be substantially the same direction as the direction in which the signal connections 40 in metal layer M3 extend. The first and second directions in which the patterned metal features 62, 64, 66, 68 extend may be substantially orthogonal.

In some embodiments, the direction in which most or all of the patterned metal features of the second grid extend may alternate in successive metal layers in the stack. For instance, in the present example, most or all of the patterned metal features 62, 64 in metal layer M2 extend in the first direction, while most or all of the patterned metal features 66, 68 in adjacent metal layer M3 extend in the second direction. In embodiments having further metal layers, this alternating arrangement may continue in those further metal layers (e.g., most or all of the patterned metal features in a metal layer M4 may extend in the first direction, most or all of the patterned metal features in a metal layer M5 may extend in the second direction, and so on). This alternating arrangement may allow capacitive and/or inductive coupling between the patterned metal features in different metal layers of the stack to be reduced.

In some embodiments, one or more of the patterned metal features forming the second grid may include one or more turns of corners. By way of example, one of the metal lines 62 shown in FIG. 5 includes two corners 63. The dimensions of the patterned metal features of the second grid may be chosen to allow them to be accommodated in areas not occupied by patterned metal features of the first grid. The dimensions of the patterned metal features of the second grid may also be chosen to allow the density of the patterned metal features of the second grid to be relatively high, such that attempts to conduct electromagnetic attacks are made more difficult. Furthermore, the layout of the patterned metal features of the second grid may be chosen to be irregular (e.g., non-repetitive and/or apparently random), within the constraints imposed by the need to place the patterned metal features of the second grid in areas not occupied by the first grid.

For instance, it is clear from inspection of FIG. 7 that the irregular and tangled appearance of the patterned metal features of the second grid, interspersed with the patterned metal features of the first grid, may make it particularly difficult to conduct electromagnetic attacks, since it may be difficult to distinguish the various patterned metal features as belonging to any particular grid of having any particular function, and since the relatively high density of the patterned metal features may inhibit attempts to detect currents using an induction loop.

In some embodiments, a width of the metal lines forming the patterned metal features of the second grid is smaller than the a width of the patterned metal features of the first grid forming power supply or ground connections of the first grid. For instance, with reference to FIGS. 5 and 6, it can be seen that the patterned metal features 62, 64, 66, 68 of the second grid are thinner than the thinnest dimension of any of the power supply connection(s) 2 or ground connection(s) 4 of the first grid.

Making the patterned metal features of the second grid relatively thin in this manner is counterintuitive since, as explained above, they may be connected to the power supply connection(s) 2 and/or ground connection(s) 4 of the first grid. Typically, metal features of a metallization stack that are required to pass current associated with power or ground connections are designed to have a minimum width that is relatively large. For instance, this minimum width may have been used to determine the minimum dimensions of the power supply connection(s) 2 and/or ground connection(s) 4 of the first grid. However, in accordance with embodiments of the present invention, it has been realised that the relatively thin width of the metal lines of the second grid may not be problematic, since the second grid is provided in addition to the power supply connection(s) 2 and/or ground connection(s) 4 of the first grid. Accordingly, the patterned metal features of the first grid may provide an additional path for current flow within the stack, which may lower the resistance presented by the features of the metallization stack to such current flows, reducing loses.

In some embodiments, the dimensions of the patterned metal features of the second grid may be chosen to be substantially equal to a design rule minimum width for metal features of the metallization stack. Accordingly, the patterned metal features of the second grid may be made as thin as possible, within the constraints imposed by the metallization technology used to form the metallization stack. The dimensions of the patterned metal features of the second grid may be chosen to match the dimensions of the patterned metal features that form signal connections of the first grid. This may further confuse attempts to conduct electromagnetic attacks against the integrated circuit, since it may be difficult to distinguish between signal connections in the metallization stack and the patterned metal features of the second grid by inspection.

As described herein, the patterned metal features of the second grid, which are interspersed with the patterned metal features of the first grid may secure the integrated circuit against electromagnetic attacks such as those using a probe having an inductive loop to detect currents flowing within the metallization stack. For instance, it may be difficult to distinguish between features of the first grid and the second grid, so that the attacker cannot be sure as to the correct metal features to probe for detecting currents flowing within the first grid. This problem faced by the attacker may be exacerbated by the irregular and/or tangled appearance of the patterned metal features in the stack. This problem may also be exacerbated where the patterned metal features of the second grid outwardly resemble the signal connections of the first grid (e.g., if they comprise metal lines having the same width).

Moreover, the electric fields associated with currents flowing within the patterned metal features of the second grid, which are connected to the first grid, may complicate detection of currents in the first grid using an induction loop. An attacker may not, for instance, be sure that a detected electric field may be attributed to current flow in a metal feature of the first grid and/or may not be sure that the detected electric field has not be distorted by current flow within the second grid. This problem may again be exacerbated by the relatively high density of the patterned metal features, which may be enabled by their relatively narrow widths. This problem may also again be exacerbated by the fact that the patterned metal features of the first and second grids may be interspersed.

An integrated circuit according to embodiments of the present invention provide a secure element. The secure element provides a tamper resistant platform for securely hosting secure applications and their confidential and cryptographic data. A secure element of this kind may, for instance, be provided in a mobile communications device such as a mobile telephone, watch, tablet or laptop.

Figure 8:
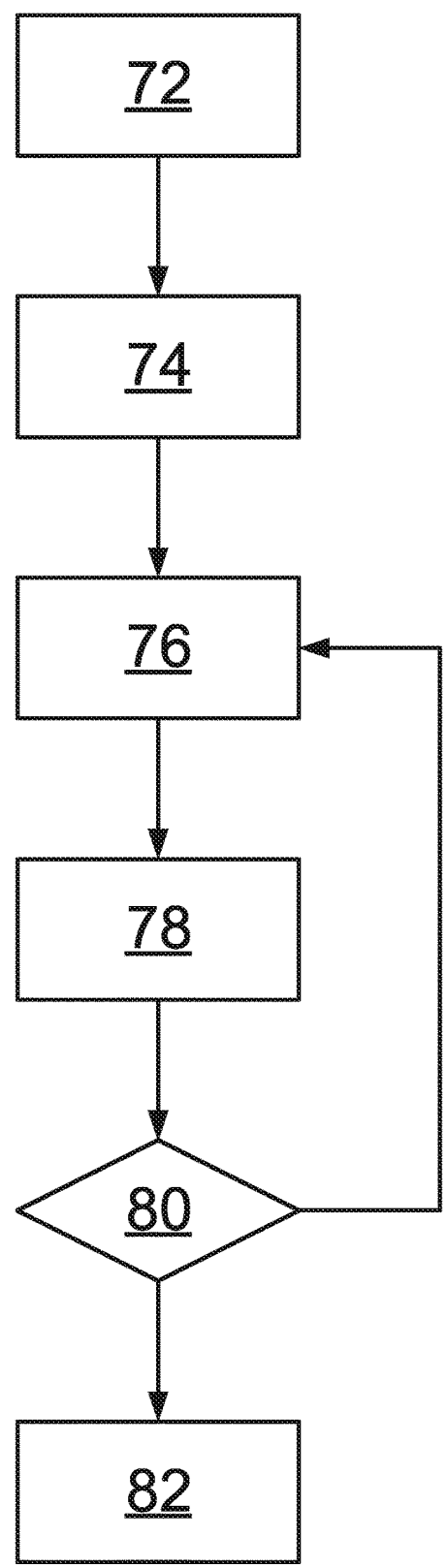
FIG. 8 is a flow chart of a method of making an integrated circuit.

FIG. 8 illustrates a method of making an integrated circuit according to an embodiment of the present invention. In a first step 72, which may be referred to as a floor planning step, the layout of the features within the semiconductor substrate of the integrated circuit may be determined, such as placing IO cells and hard macro modules and determining the outlines for digital core areas.

In a next step 74, based on the knowledge of the layout determined in step 72, the layout of the power supply connection(s) and/or ground connection(s) of the first grid may be determined. In a next step 76, based on the knowledge of the layout determined in step 74, the standard layout including all components and their signal connections of the first grid may be determined. And in a next step 78, based on the knowledge of the layouts determined in steps 74 and/or 76, the layout of the patterned metal features of the second grid may be determined. As noted previously, this may include identifying areas in the metallization stack that are not occupied by the patterned metal features of the first grid and locating the patterned metal features of the second grid in those areas.

In a next step 80, the layout of the metallization stack may be checked and approved. If the layout is not approved, then the method may return to step 76, to allow changes to be made to the patterned metal features of the first and second grids prior to re-checked. If, in step 80, the layout of the metallization stack is approved, then the method may proceed to step 82, in which an integrated circuit may be manufactured having a metallization stack according to the design determined and checked in steps 72 to 80.

Step 82 may include providing a semiconductor substrate and forming the designed metallization stack located on a major surface of the semiconductor substrate. As previously described, the metallization stack may include a plurality of metal layers including patterned metal features, and each metal layer of the metallization stack may be separated by an intervening dielectric layer. Forming the metallization stack may include forming the first grid including patterned metal features for supplying power and providing signal connections to components of the integrated circuit located in the semiconductor substrate. Forming the metallization stack may also include forming the second grid for securing the integrated circuit against electromagnetic attacks. As previously noted, the second grid may include patterned metal features interspersed with the patterned metal features of the first grid in at least some of the metal layers of the metallization stack. The patterned metal features of the second grid may be electrically connected to the first grid.

In accordance with embodiments of the present invention, it has been realised that ECOs may be implemented by making use of the patterned metal features of the second grid of a metallization stack of the kind described herein. As has been explained previously, engineering change orders associated with an integrated circuit design may take place relatively late in the design and manufacturing process. These ECOs may typically include changing the layout of a metallization stack provided on a major surface of the integrated circuit, thereby to implement different electrical connections between components of the integrated circuit located in the semiconductor substrate upon which the metallization stack is located.

Typically, the changes to the metallization stack can be implemented by making changes to the mask set used to pattern the metal features of each layer of the stack. By making use of the patterned metal features of the second grid to implement an engineering change order, new connections may be formed between the patterned metal features of the first grid, for instance for forming new signal connections, ground line connections or power line connections within the metallization stack. In the context of a metallization stack having first and second grids of the kind described above, and with reference to FIG. 7, it will be appreciated that making new connections between the patterned metal features of a first grid of the stack may be complicated, owing to the presence of the patterned metal features of the second grid, which are interspersed with the patterned metal features of a first grid. This is because the patterned metal features of the second grid may block the addition of a direct connection between two patterned metal features of the first grid, which the engineering change order requires to be connected together. This problem can be solved by using the patterned metal features of the second grid themselves to implement the new connection.

Nevertheless, and as will be described below in more detail, in some embodiments it may be necessary to remove or at least partially remove some of the patterned metal features of the second grid and/or to add further patterned metal features to the first grid to implement the required connections. In some embodiments it has been found that by making use of the existing patterned metal features of the second grid, the need to make changes to the locations and/or the number of vias provided in the dielectric layers located in between the layers of the metallization stack that include the patterned metal features of the first and second grids may be avoided. In other words, by making use of the patterned metal features of the second grid, the need to change the layout for the masks that are used to define the via layers of the stack may be avoided. In this way costs can be saved, since the same masks for the via layers can be used for the amended design of the metallization stack and it may only be necessary to make changes to one or more of the masks associated with the layers containing the patterned metal features of the first and second grids.

An example of the changing of the layout of a metallization stack of an integrated circuit in accordance with an engineering change order will now be described in relation to FIGS. 9-12.

Figure 9:
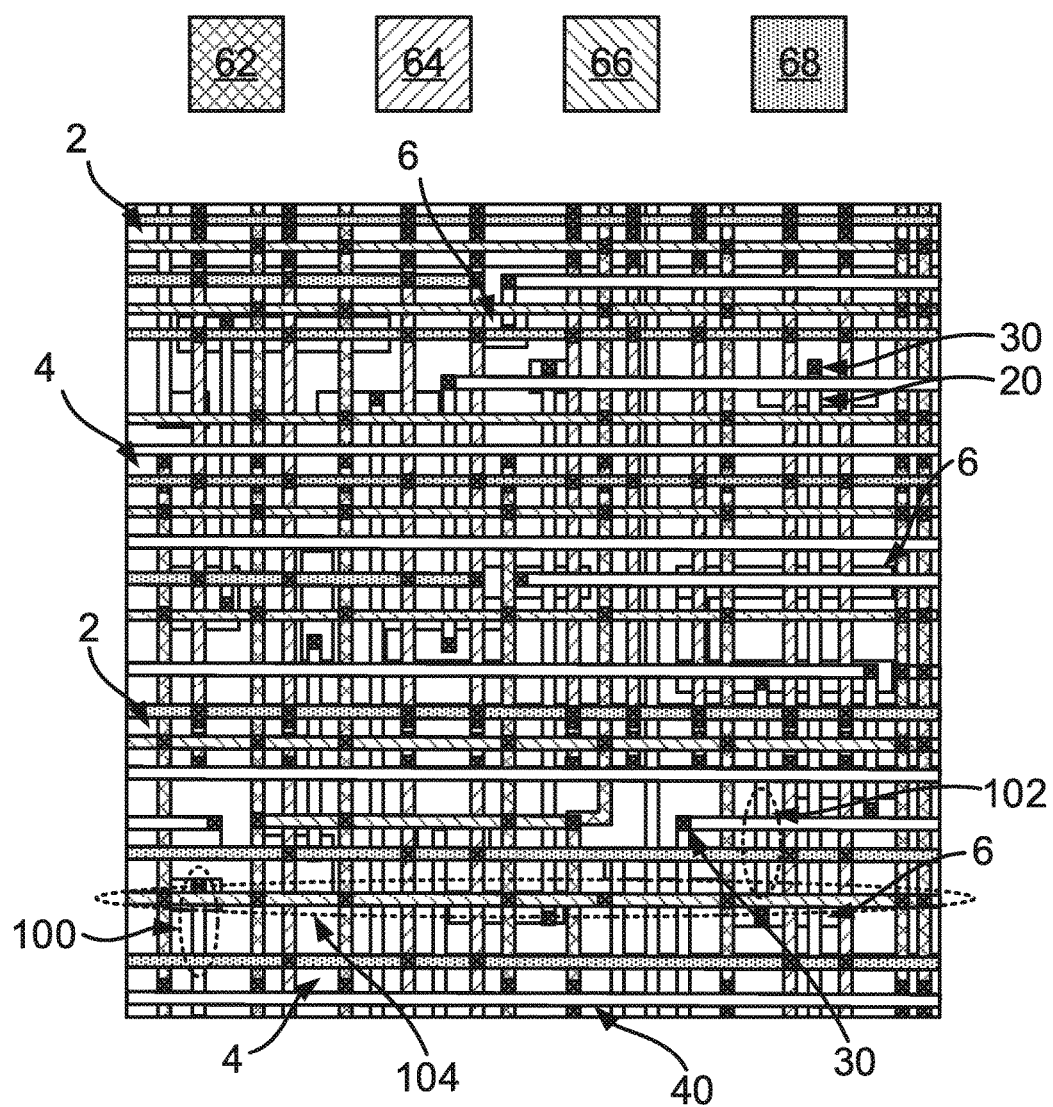
FIGS. 9-12 illustrate a number of steps for performing a post-mask ECO on an integrated circuit of the kind described in relation to FIGS. 1 to 8, according to an embodiment of the present invention.

FIG. 9 shows a view of an integrated circuit in accordance with an embodiment of the present invention. The integrated circuit is in many ways similar to the integrated circuits described above in relation to FIGS. 1-7. The integrated circuit includes one or more power supply connections 2 and one or more ground connections 4 located in metal layer M1 of a metallization stack as described above in relation to, for example, FIG. 1. Metal layer M1 of the metallization stack also includes a number of signal connections 6, again as described above in relation to FIG. 1.

Again, the metallization stack can include one or more signal connections located in other layers of the stack. For instance, as described in relation to FIG. 2, in the present example, the metal layer M2 of the stack includes one or more signal connections 20 comprising metal lines extending over the major surface of the semiconductor substrate upon which the stack is located. Also, as per the example described above in relation to FIG. 2, one or more metal filled vias 30 may be provided, which extend through the intervening dielectric layers of the metallization stack to interconnect the signal connections 20 of the metal layer M2 with signal connections located in other metal layers of the stack, such as metal layers M1 and/or M3.

As explained previously, the vias 30 in the intervening dielectric layers, as well as the patterned metal features of the first and second grids, may be formed using standard metallization techniques involving the use of photolithography and one or more patterned masks. As described above in relation to FIG. 3, signal connections 40 may be provided in a metal layer M3 in the present embodiment. As with the signal connections 20 in layer M2, the signal connections 40 may comprise one or more metal lines extending across the surface of the semiconductor substrate within the metallization stack. Also as described previously, the signal lines 20 and the signal lines 40 may extend in orthogonal directions in adjacent layers of the stack.

In the present embodiment, the first grid of the metallization stack includes the power supply connections 2 and/or ground connections 4, the signal connections 20, 40, as well as the metal filled vias 30 described above. A second grid of the stack may include patterned metal features such as those shown in FIG. 9 (see the metal lines 62, 64, 66, 68). In common with the embodiment described above in relation to FIG. 5, the patterned metal features comprising the metal lines 62 may be located in metal layer M2 and may be connected to ground connections of the first grid. The patterned metal features 64 may also be located in metal layer M2 of the stack and may be connected to the power supply connections of the first grid. The patterned metal features 66 of the second grid may be located in metal layer M3 and may be connected to ground connections of the first grid. The patterned metal features 68 may also be located in metal layer M3 and may be connected to power supply connections of the first grid.

Thus, the metallization stack shown in FIG. 9 includes first and second grids, the first grid including patterned metal features for supplying power and providing signal connections to components of the IC located in a semiconductor substrate of the device, and a second grid including patterned metal features that are interspersed with the patterned metal features of the first grid in at least some layers of the metallization stack, with the patterned metal features of the second grid being electrically connected to the first grid. As already explained above, the patterned metal features of the second grid can allow protection against tampering by making it difficult to use a probe such as an induction loop to sense the signals passing through the patterned metal features of the first grid. It will be appreciated that the exact layout of the patterned metal features of the first and second grids are not essential to the present invention, and the particular layouts shown in the Figures are just examples.

An example of a layout change to be made to the stack shown in FIG. 9, in accordance with an ECO, will now be described. For the sake of the example of FIG. 9, it is assumed that the ECO requires two signal connections 20 to be connected together. The first of these signal connections 20 is indicated in FIG. 9 using the dotted area labelled 100, while the second of these signal connections is indicated using the dotted area 102. Both signal connections 100, 102 in this example are located in metal layer M2.

Inspection of FIG. 9 reveals that connecting the signal connections 100 and 102 together may be difficult in view of the presence of a number of intervening patterned metal features. For instance, metal layer M2 includes a number of patterned metal features 62, 64 of the second grid connected to ground connections and/or power supply connections of the first grid. In the present example, these patterned metal features 62, 64 extend within metal layer M2 in a direction parallel to the direction in which the signal connections 100, 102 (also in M2) extend.

In order to implement the connection together of the signal connections 100, 102 in the present example, use will be made of one or more patterned metal features of the second grid. In particular, in this example, one of the patterned metal features 66 of the second grid, which (in accordance with the original design) is connected to one or more ground connections of the first grid, will be used. This patterned metal feature, which is located in metal layer M3, is indicated in FIG. 9 using the dotted area labelled 104. As will be described in more detail below, although most of the new connection between the signal connections 100, 102 in the present example will be formed by a part of the patterned metal feature 104, other features will also be involved. These will include, for instance, some vestigial parts 114 of some of the patterned metal features 62 of the second grid, new connections 112, 116 in metal layer M2, and one or more of the vias 30 of the original design linking the patterned metal features together between the metal layers M2 and M3. In this example, changes to the layout of the metallization stack will be made to form connections between the signal connections 100 and 102 and the patterned metal feature 104. In order to prevent short circuiting between the first grid and the second grid, the patterned metal feature 104 will also be disconnected from other features of the metallization stack. More particularly, in this example, the patterned metal feature 104 will be disconnected from the patterned metal features 62 of the second grid (in metal layer M2) to which it is, in accordance with the original design, connected by a number of vias (as can be seen in FIG. 9).

Figure 10:
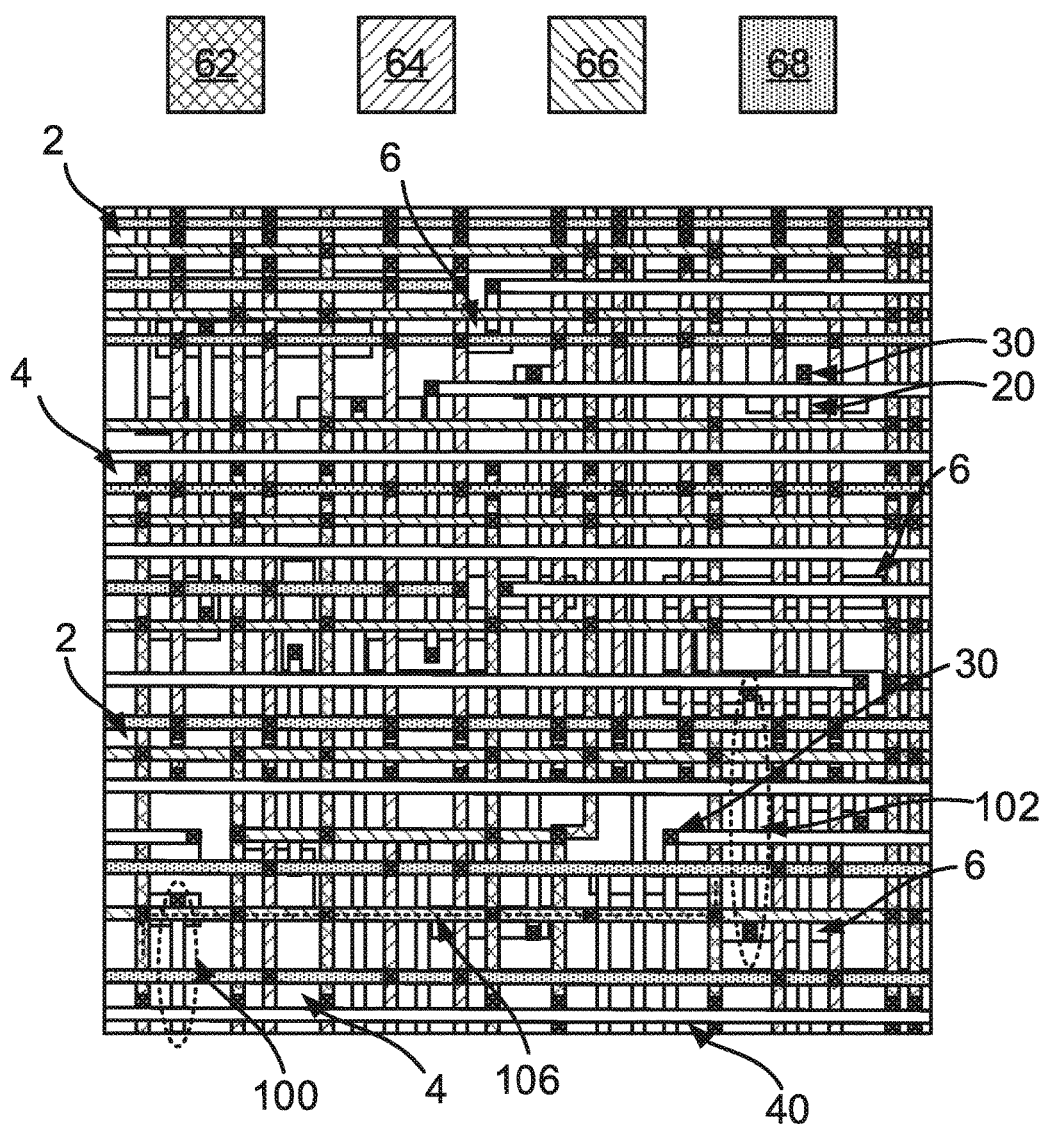

The approximate route of the new connection between the signal connections 100 and 102 is shown by the dotted line 104 in FIG. 10. Note that because the patterned metal feature 104 is located in metal layer M3, it can bridge the gap between the signal connections 100 and 102 without being blocked by the intervening patterned metal features 62, 64 of the second grid located in metal layer M2. In order to disconnect the patterned metal feature from the other features of the second grid, one or more disconnections may be made relative to the initial design. The locations of these disconnections in the present example are shown using the "z" shaped symbols labelled 108 in FIG. 11.

At least one of the disconnections 108 may involve removing a part of the patterned metal feature 104 itself. For instance, in FIG. 11, one of the disconnections 108 is made in the patterned metal feature 104 itself, in a position near the signal connection 102. This disconnection 108 disconnects a part of the patterned metal feature 104 that is to be used to connect together the signal lines 100, 102 from another part of the patterned metal feature 104 that is not needed to make the connection between the signal lines 100, 102. Note from FIG. 11 that the unused part of the patterned metal feature is connected to two patterned metal features 62 of the second grid located in metal layer M2, whereby this disconnection will also prevent unwanted shorting between the signal lines 100, 102 and the two patterned metal features 62 of the second grid in the finished design. It is envisaged that one or more further disconnections of this kind may be made in the patterned metal feature 104 to implement the ECO.

At least one of the disconnections 108 may involve removing a part of a patterned metal feature to which the patterned metal feature 104 is connected (i.e., as opposed to making a disconnections 108 in the patterned metal feature 104 itself). In the embodiment shown in FIG. 11 there are twelve disconnections 108 of this kind. In this example, these disconnections 108 disconnect parts of the patterned metal features 62 (located in metal layer M2), which are connected to the patterned metal feature 104 by one or more vias, from other parts (e.g. see the remaining part 118 indicated in FIG. 12) of those patterned metal features 62. These disconnections therefore prevent unwanted short circuiting between the signal lines 100, 102 and the aforementioned other parts of the patterned metal features 62 of the second grid in the final design.

Figure 11:
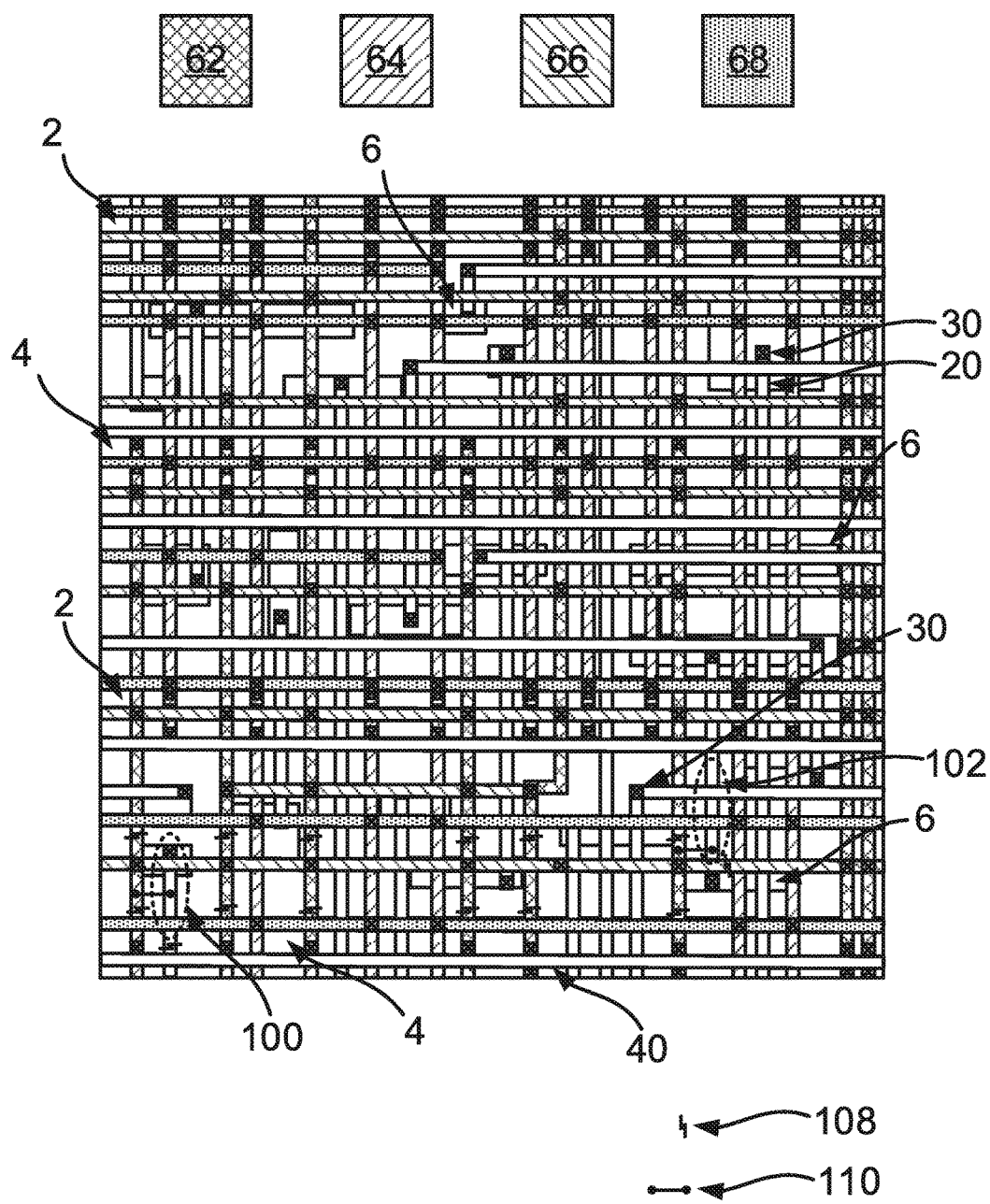

One or more disconnections 108 may also be made in the signal lines 100, 102. For instance, in FIG. 11 it is shown that a disconnection 108 is to be made in the signal line 100. These disconnections are used to disconnect parts of the signal lines 100, 102 from other parts of the signals lines, in accordance with the ECO. In order to connect the patterned metal feature 104 to the signal connections 100 and 102, a number of new patterned metal features may added to the metallization stack. In accordance with embodiments of the present invention, these new features are added in the metal layers of the metallization stack, so that it does not become necessary to make changes to the masks that are used to pattern the vias in the intervening dielectric layers of the stack. In the example of FIG. 11, these new connections are indicated by the symbols labelled 110.

In this embodiment, a first of the new connections 110 will connect the signal line 100 to a part of one of the patterned metal features 62 in metal layer M2 (to which the patterned metal feature 104 in metal layer M3 is connected by a via). This will form the connection between the signal line 100 and the patterned metal feature 104. Note that the part of the patterned metal feature 62 to which the new connection 110 is made is to be disconnected from other parts of the patterned metal feature 62 as discussed above. A second of the new connections 110 connects the signal line 102 to a part of one of the patterned metal features 62 in metal layer M2 (to which the patterned metal feature 104 in metal layer M3 is connected by a via). This will form the connection between the signal line 102 and the patterned metal feature 104. Note that the part of the patterned metal feature 62 to which the new connection 110 is made is to be disconnected from other parts of the patterned metal feature 62 as discussed above.

It is envisaged that further new connections 110 may be made in accordance with the ECO. For instance, it is envisaged that new connections may be made between two or more patterned metal features of the second grid, in order to implement the routing of the connection between the signal lines 100, 102.

Figure 12:
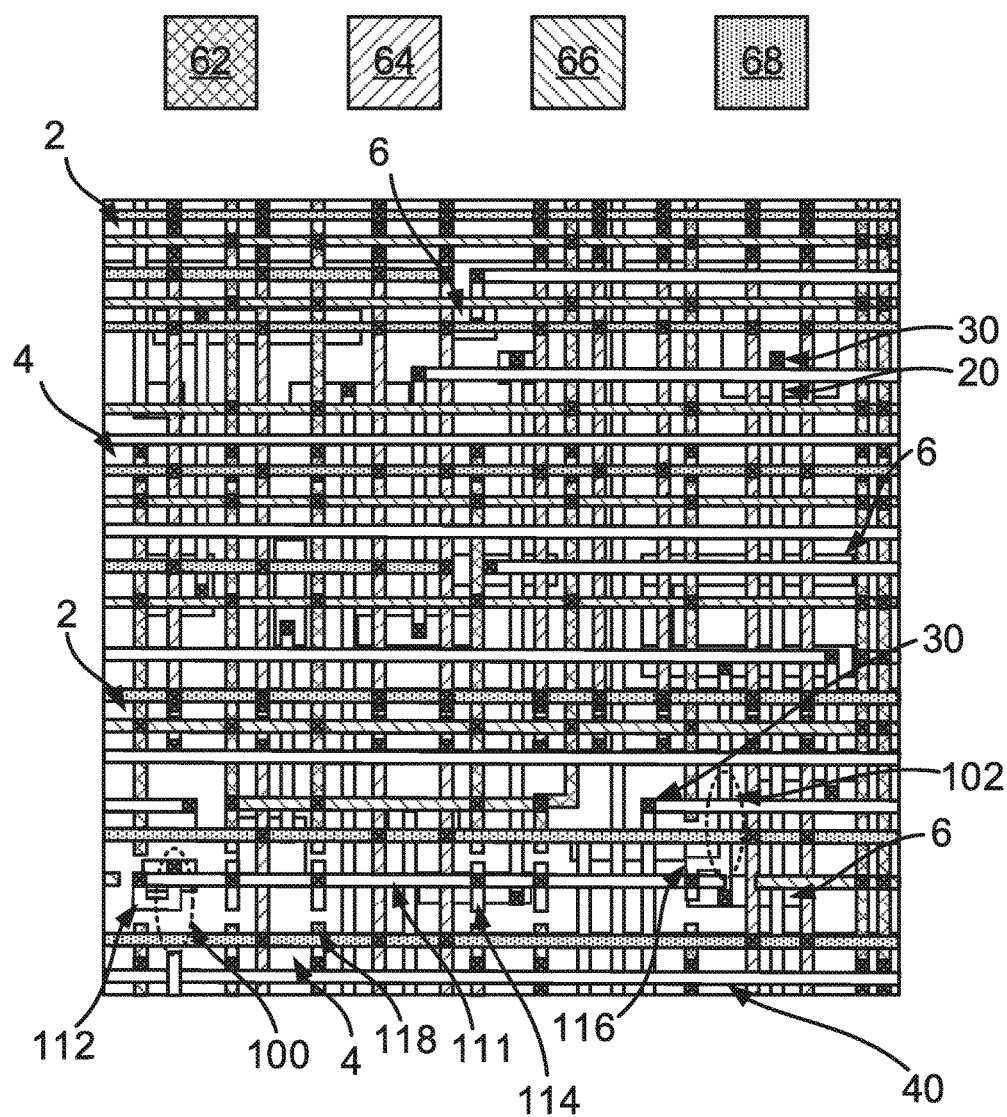

FIG. 12 shows the new layout of the metallization stack, after the above described disconnections 108 and new connections 110 have been made, in accordance with the ECO. As shown in FIG. 12, the above-described disconnections 108 and new connections 110 form a new connection 111 between the signal lines 100, 102. The new connection 111 in this embodiment includes:

a part of the patterned metal feature 104;

some vestigial parts 114 of the patterned metal features 62 that have been disconnected from other parts of the patterned metal features (these are connected to the aforementioned part of the patterned metal feature 104 by the aforementioned vias);

a new connection 112 connecting the patterned metal feature 104 to the signal line 100, the new connection comprising the aforementioned disconnected part of one of the neighbouring patterned metal features 62 plus an additional metal part added in the metal layer M2 between the signal line 100 and the neighbouring patterned metal feature 62; and a new connection 116 connecting the patterned metal feature 104 to the signal line 102, the new connection comprising a disconnected part of one of the patterned metal features 62 neighbouring the signal line 102 plus an additional metal part added in the metal layer M2 between the signal line 102 and the neighbouring patterned metal feature 62.

It is again emphasised that the new layout in FIG. 12 is just an example, and that it is envisaged that a new layout for a metallization stack, implementing and ECO, may include a combination of one or more features of the kind listed above. The actual features used in the new layout for implementing the ECO will largely depend upon the original layout and the requirements of the ECO itself, however the general principle of implementing the layout change may include the disconnection from the second grid at least one patterned metal feature of the second grid, and the connection of the disconnected patterned metal feature of the second grid to at least one patterned metal feature of the first grid.

Note that the layout of the vias in the intervening dielectric layers in the new layout in FIG. 12 is unchanged with respect to the original layout shown in unchanged with respect to the layout shown in FIG. 9. Accordingly, in the present example, it would not be necessary to make changes to the masks that are used to pattern the vias.

In this embodiment, one of the signal lines 100, 102 may, in the initial design, be connected to a spare cell of components of the integrated circuit located in the semiconductor substrate. This signal line may be otherwise isolated from the first grid in the initial design, with the signal line of the spare cell being provided merely to provide connections and routing for the spare cell, in the event that it is determined as part of an ECO that the spare cell is needed. The above described layout change may connect the signal line of the spare cell to the other of the signal lines 100, 102. In this way, the layout change may connect at least one patterned metal feature of the first grid to the spare cell, thereby to incorporate a previously redundant spare cell and the components thereof into the functional part of the final design in accordance with the ECO.

Figure 13:
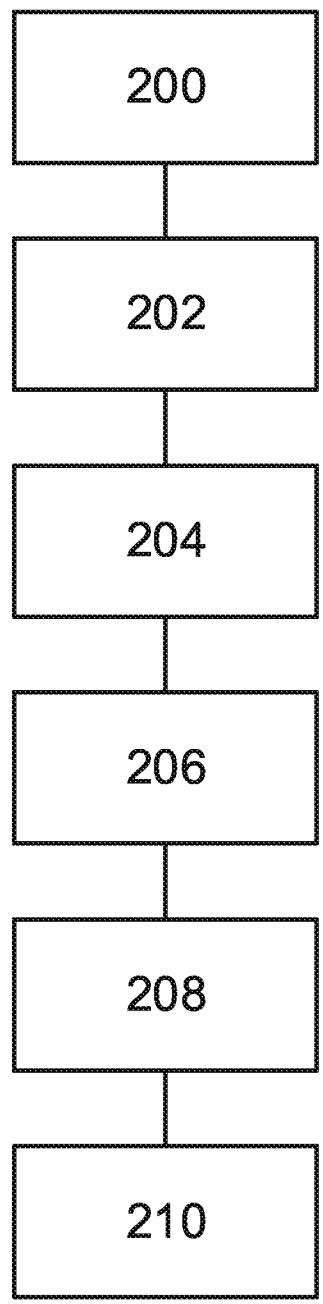
FIG. 13 is a flow chart of a method of making an integrated circuit according to an embodiment of the present invention.

FIG. 13 illustrates a number of steps in an example of a method of making an integrated circuit in accordance with an embodiment of the present invention. The method may include making an initial design for a layout for a metallization stack of an integrated circuit of the kind described herein. As mentioned previously, the initial design of the metallization stack may include a plurality of metal layers including patterned metal features, each metal layer of the metallization stack being separated by an intervening dielectric layer.

Making the initial design may include, in step 200, determining a layout of a first grid of the metallization stack. The first grid may include, as mentioned previously, patterned metal features for supplying power and providing signal connections to components of the integrated circuit located in the semiconductor substrate.

Making the initial design may include, in step 202, determining a layout of a second grid of the metallization stack for securing the integrated circuit against electromagnetic attacks. As mentioned previously, the second grid may include patterned metal features interspersed with the patterned metal features of the first grid in at least some of the metal layers of the metallization stack. The patterned metal features of the second grid may be electrically connected to the first grid.

In steps 204-206, the method may include determining at least one layout change for the metallization stack in accordance with an engineering change order. For instance in step 204, the method may include determining a layout change including the disconnection from the second grid at least one patterned metal feature of the second grid. Also, in step 206, the method may include determining a layout change including the connection of the disconnected patterned metal feature of the second grid to at least one patterned metal feature of the first grid. Steps 204 and 206 may involve determining the locations of one or more disconnections 108 and/or new connections 110 of the kind described above in relation to FIG. 11.

In step 208, using the new design layout, the masks used to form the metallization stack may be modified in view of the updated layout in accordance with the ECO. In step 210, the metallization stack having the updated layout may be formed on the major surface of the semiconductor substrate. It will be appreciated that step 210 may itself form part of a larger manufacturing process including front and as well as back end processing, dicing and packaging.

The design stage steps (e.g., steps 200-206) of the above described method may be implemented using a suitably programmed computer. Accordingly, there may be provided a computer-readable storage medium including computer-readable instruction code for performing a method of designing a layout of the metallization stack. The computer-readable storage medium may, for instance, be an optical disk such as a CD, DVD or Blu-ray disc, a hard disk drive (HDD), or solid a state memory such as ROM, RAM, an SDD or a memory stick.

Accordingly, there has been described an integrated circuit and a method of making the same. The integrated circuit includes a semiconductor substrate. The integrated circuit also includes a metallization stack located on a major surface of the semiconductor substrate. The metallization stack includes a plurality of metal layers including patterned metal features. Each metal layer of the metallization stack is separated by an intervening dielectric layer. The metallization stack forms a first grid including patterned metal features for supplying power and providing signal connections to components of the integrated circuit located in the semiconductor substrate. The metallization stack also forms a second grid for securing the integrated circuit against electromagnetic attacks. The second grid includes patterned metal features interspersed with the patterned metal features of the first grid in at least some of the metal layers of the metallization stack. The patterned metal features of the second grid are electrically connected to the first grid.

Accordingly, there has also been described a method of designing a layout of a metallization stack of an integrated circuit. The stack includes a plurality of metal layers including patterned metal features. The method includes determining a layout of a first grid of the metallization stack, including patterned metal features for supplying power and providing signal connections to components of the integrated circuit. The method also includes determining a layout of a second grid of the stack for securing the integrated circuit against electromagnetic attacks. The second grid includes patterned metal features interspersed with the patterned metal features of the first grid in at least some of the metal layers of the metallization stack. The patterned metal features of the second grid are electrically connected to the first grid. The method further includes determining at least one layout change for the metallization stack in accordance with an engineering change order.

Although particular embodiments of the present invention have been described, it will be appreciated that many modifications/additions and/or substitutions may be made within the scope of the claims.

The invention claimed is:

1. A method of designing a layout of a metallization stack to be located on a major surface of a semiconductor substrate of an integrated circuit, the metallization stack comprising a plurality of metal layers including patterned metal features, wherein each metal layer of the metallization stack is separated by an intervening dielectric layer, the method comprising:

determining a layout of a first grid of the metallization stack, including patterned metal features for supplying power and providing signal connections to components of the integrated circuit located in the semiconductor substrate;

determining a layout of a second grid of the metallization stack for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid; and determining at least one layout change for the metallization stack in accordance with an engineering change order (ECO), wherein the layout change comprises:

the disconnection from the second grid of at least one patterned metal feature of the second grid; and the connection of the disconnected patterned metal feature of the second grid to at least one patterned metal feature of the first grid.

2. The method of claim 1, wherein the connection of the disconnected patterned metal feature of the second grid to at least one patterned metal feature of the first grid comprises the connection of the disconnected patterned metal feature of the second grid to at least one patterned metal feature of the first grid that provides signal connections to components of the integrated circuit located in the semiconductor substrate.

3. The method of claim 1, wherein the connection of the disconnected patterned metal feature of the second grid to the least one patterned metal feature of the first grid connects together two patterned metal features of the first grid.

4. The method of claim 1, wherein the at least one layout change connects at least one patterned metal feature of the first grid to a spare cell of components of the integrated circuit located in the semiconductor substrate.

5. The method of claim 1, wherein the first and second grids each include a plurality of metal filled vias located in the intervening dielectric layers for interconnecting patterned metal features of the grids located in different metal layers of the metallization stack, and wherein the determining at least one layout change for the metallization stack in accordance with the ECO includes incorporating at least one metal filled via of the second grid into the first grid.

6. The method of claim 5, wherein the patterned metal feature of the first grid to which the patterned metal feature of the second grid is to be connected is located in a first layer of the metallization stack, and wherein the incorporating at least one metal filled via of the second grid into the first grid comprises adding one or more further patterned metal features to the first grid in the first layer of the metallization stack, to connect the patterned metal feature of the first grid to the at least one via.

7. The method of claim 1, wherein the determining the layout change further comprises the disconnection of at least one patterned metal feature of the second grid from at least one other patterned metal feature of the second grid.

8. The method of claim 1, wherein the patterned metal features of the first grid and the second grid comprise metal lines extending within at least some of the metal layers of the metallization stack.

9. The method of claim 1, wherein at least some of the patterned metal features of the second grid are electrically connected to patterned metal features of the first grid that form power supply connections or ground connections of the first grid.

10. A method of making an integrated circuit comprising a semiconductor substrate and a metallization stack located on a major surface of the semiconductor substrate, the metallization stack comprising a plurality of metal layers including patterned metal features, wherein each metal layer of the metallization stack is separated by an intervening dielectric layer, the method comprising:

designing a layout of the metallization stack by:

determining a layout of a first grid of the metallization stack, including patterned metal features for supplying power and providing signal connections to components of the integrated circuit located in the semiconductor substrate;

determining a layout of a second grid of the metallization stack for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid;

determining at least one layout change for the metallization stack in accordance with an engineering change order (ECO), wherein the layout change comprises:

the disconnection from the second grid at least one patterned metal feature of said second grid; and the connection of the disconnected patterned metal feature of the second grid to at least one patterned metal feature of the first grid; and forming the metallization stack on the major surface of the semiconductor substrate according to the designed layout.

11. The method of claim 10, wherein the connection of the disconnected patterned metal feature of the second grid to at least one patterned metal feature of the first grid comprises the connection of the disconnected patterned metal feature of the second grid to at least one patterned metal feature of the first grid that provides signal connections to components of the integrated circuit located in the semiconductor substrate.

12. The method of claim 10, wherein the connection of the disconnected patterned metal feature of the second grid to the least one patterned metal feature of the first grid connects together two patterned metal features of the first grid.

13. The method of claim 10, wherein the at least one layout change connects at least one patterned metal feature of the first grid to a spare cell of components of the integrated circuit located in the semiconductor substrate.

14. The method of claim 10, wherein the first and second grids each include a plurality of metal filled vias located in the intervening dielectric layers for interconnecting patterned metal features of the grids located in different metal layers of the metallization stack, and wherein the determining at least one layout change for the metallization stack in accordance with the ECO includes incorporating at least one metal filled via of the second grid into the first grid.

15. The method of claim 14, wherein the patterned metal feature of the first grid to which the patterned metal feature of the second grid is to be connected is located in a first layer of the metallization stack, and wherein the incorporating at least one metal filled via of the second grid into the first grid comprises adding one or more further patterned metal features to the first grid in the first layer of the metallization stack, to connect the patterned metal feature of the first grid to the at least one via.

16. The method of claim 10, wherein the determining the layout change further comprises the disconnection of at least one patterned metal feature of the second grid from at least one other patterned metal feature of the second grid.

17. The method of claim 10, wherein the patterned metal features of the first and second grids comprise metal lines extending within at least some of the metal layers of the metallization stack.

18. The method of claim 10, wherein at least some of the patterned metal features of the second grid are electrically connected to patterned metal features of the first grid that form power supply connections or ground connections of the first grid.

19. An integrated circuit comprising a semiconductor substrate and a metallization stack located on a major surface of the semiconductor substrate, the metallization stack comprising a plurality of metal layers including patterned metal features, wherein each metal layer of the metallization stack is separated by an intervening dielectric layer, the integrated circuit fabricated by a method comprising:

designing a layout of the metallization stack by:
    determining a layout of a first grid of the metallization stack, including patterned metal features for supplying power and providing signal connections to components of the integrated circuit located in the semiconductor substrate;
    determining a layout of a second grid of the metallization stack for securing the integrated circuit against electromagnetic attacks, wherein the second grid includes patterned metal features interspersed with the patterned metal features of the first grid in at least some of the metal layers of the metallization stack, and wherein the patterned metal features of the second grid are electrically connected to the first grid;
    determining at least one layout change for the metallization stack in accordance with an engineering change order, wherein the layout change comprises:
        the disconnection from the second grid at least one patterned metal feature of the second grid; and
        the connection of the disconnected patterned metal feature of the second grid to at least one patterned metal feature of the first grid; and
forming the metallization stack on the major surface of the semiconductor substrate according to the designed layout.

\* \* \* \* \*